(12) United States Patent
Izaki

(10) Patent No.: US 12,518,991 B2
(45) Date of Patent: Jan. 6, 2026

(54) INDUSTRIAL MAGAZINE RACK

(71) Applicant: Nix, Inc., Yokohama (JP)

(72) Inventor: Eriko Izaki, Sagamihara (JP)

(73) Assignee: Nix, Inc., Yokohama (JP)

( * ) Notice: Subject to any disclaimer, the term of this patent is extended or adjusted under 35 U.S.C. 154(b) by 0 days.

(21) Appl. No.: 18/857,895

(22) PCT Filed: Apr. 6, 2023

(86) PCT No.: PCT/JP2023/014227
§ 371 (c)(1),
(2) Date: Oct. 18, 2024

(87) PCT Pub. No.: WO2023/204039
PCT Pub. Date: Oct. 26, 2023

(65) Prior Publication Data
US 2025/0273495 A1 Aug. 28, 2025

(30) Foreign Application Priority Data
Apr. 22, 2022 (JP) .................................. 2022-070858

(51) Int. Cl.
*H01L 21/673* (2006.01)
*H01L 21/00* (2006.01)
(Continued)

(52) U.S. Cl.
CPC .......... *H01L 21/6732* (2013.01); *H01L 21/00* (2013.01); *H01L 21/67309* (2013.01); *H05K 7/186* (2013.01); *H05K 13/0069* (2013.01)

(58) Field of Classification Search
CPC . H01L 21/6732; H01L 21/00; H01L 21/6734; H01L 21/67309; H01L 21/673;
(Continued)

(56) References Cited

U.S. PATENT DOCUMENTS 4,761,044 A * 8/1988 Akama ................ H05K 7/1418
312/331
5,593,046 A * 1/1997 Katsuura .............. H05K 7/1424
312/258
(Continued)

FOREIGN PATENT DOCUMENTS

CN 209536116 U 10/2019
CN 215299202 U * 12/2021
(Continued)

OTHER PUBLICATIONS

International Search Report (PCT/ISA/210) issued in PCT Application No. PCT/JP2023/014227 dated Jun. 20, 2023 with English translation (5 pages).
(Continued)

*Primary Examiner* — Devin K Barnett
(74) *Attorney, Agent, or Firm* — Crowell & Moring LLP

(57) ABSTRACT

Provided is an industrial magazine rack in which a biasing mechanism for biasing a stopper member to a closed position or an open position is prevented from coming into contact with a board-shaped member housed in a rack main body. The industrial magazine rack includes a base fixed to a lower surface of a top plate or an upper surface of a bottom plate, a pivot bracket for supporting the stopper member, which is supported by the base so as to be pivotable on a pivot axis extending in a vertical direction on an outside of a side plate, and a torsion coil spring having a first end portion mounted to the base on an outside of a pivot center of the pivot bracket in a left and right direction and a second end portion mounted to the pivot bracket between the pivot center of the pivot bracket and the first end portion in the left and right direction, and the torsion coil spring is formed to bias the stopper member toward the closed position when the second end portion is on one side of an imaginary line connecting the pivot center of the pivot bracket and the first
(Continued)

end portion, and bias the stopper member toward the open position when the second end portion is on another side of the imaginary line.

9 Claims, 9 Drawing Sheets

(51) Int. Cl.
   *H05K 7/18* (2006.01)
   *H05K 13/00* (2006.01)
(58) Field of Classification Search
   CPC ....... B65D 85/48; B65D 25/06; G02F 1/1303; H05K 13/0069; H05K 7/186; Y10S 206/832
   See application file for complete search history.

(56) References Cited

U.S. PATENT DOCUMENTS

| | | | | |
|---|---|---|---|---|
| 6,328,169 | B1* | 12/2001 | Matsuda | H05K 13/0069 361/752 |
| 6,948,623 | B2* | 9/2005 | Takano | H01L 21/67309 211/41.1 |
| 7,163,110 | B2* | 1/2007 | Huang | H01L 21/6734 211/41.18 |
| 7,246,708 | B2* | 7/2007 | Chuang | A47B 81/00 211/41.18 |
| 7,819,261 | B2* | 10/2010 | Mayuzumi | H05K 7/1409 211/26 |
| 9,656,797 | B2* | 5/2017 | Hong | H01L 21/6734 |
| 10,562,704 | B2* | 2/2020 | Lu | B65G 1/026 |
| 2002/0184831 | A1* | 12/2002 | Matsuda | A47B 45/00 52/27 |
| 2003/0132176 | A1* | 7/2003 | Takano | H01L 21/6734 211/41.1 |
| 2006/0231515 | A1* | 10/2006 | Chou | H01L 21/6734 211/41.18 |
| 2008/0258587 | A1* | 10/2008 | Mayuzumi | B65D 21/08 312/111 |
| 2024/0079263 | A1* | 3/2024 | Hsiao | H01L 21/68721 |

FOREIGN PATENT DOCUMENTS

| | | |
|---|---|---|
| CN | 114084510 A | 2/2022 |
| JP | 62-34509 U | 2/1987 |
| JP | 8-119371 A | 5/1996 |

OTHER PUBLICATIONS

Japanese-language Written Opinion (PCT/ISA/237) issued in PCT Application No. PCT/JP2023/014227 dated Jun. 20, 2023 with English translation (5 pages).

* cited by examiner

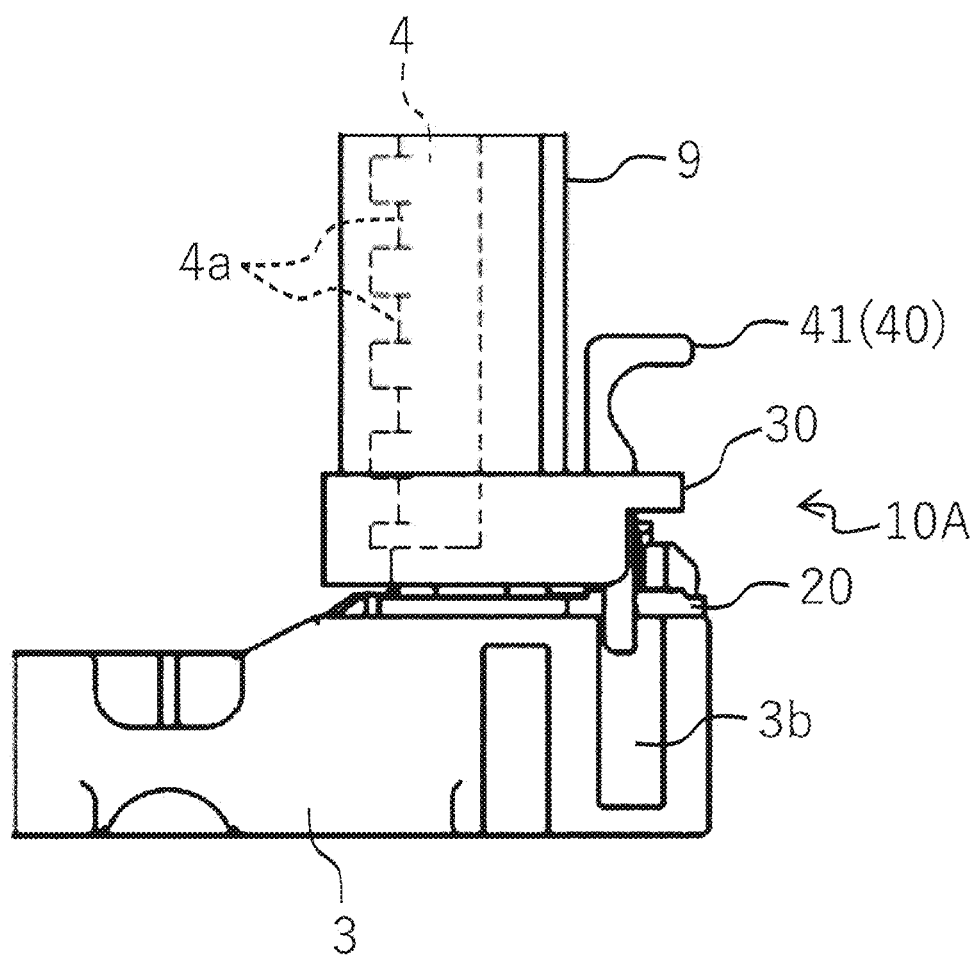
FIG. 2A
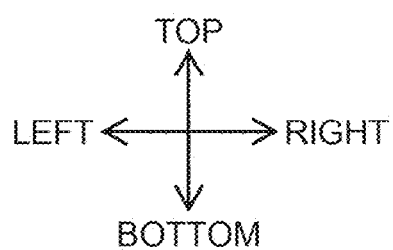

INDUSTRIAL MAGAZINE RACK

TECHNICAL FIELD

The present invention relates to an industrial magazine rack, in which board-shaped members such as printed wiring boards, liquid crystal substrates, disk substrates, semiconductor wafers, and the like are to be housed.

BACKGROUND ART

In manufacturing lines of products, magazine racks for industry use are used in conveyance of board-shaped members which are substrate materials. For example, in a manufacturing line of mounting a predetermined electronic circuit component on a printed wiring board to manufacture a mounted substrate, an industrial magazine rack is installed on a conveyance base connecting a process of manufacturing the printed wiring board and a process of mounting the electronic circuit component. After a plurality of pieces of printed wiring boards manufactured in the process of manufacturing the printed wiring board is sequentially housed in an empty industrial magazine rack, the industry magazine rack is transported to the process of mounting the electronic circuit component. In the process of mounting the electronic circuit component, the printed wiring boards housed in the industrial magazine rack are taken out one by one so that the electronic circuit component can be mounted thereon, and then the manufactured mounted board is housed in the industrial magazine rack again. The industrial magazine rack in which the mounted boards are housed is removed from the conveyance base by an operator, and transported to a predetermined storage place or a next process.

As described above, an industrial magazine rack may be removed from the conveyance base by an operator and transported to other places, and in such a case, it is practically difficult to keep the industrial magazine rack horizontal. This may easily cause the inconvenience, for example, the board-shaped member may project from the industrial magazine rack during conveyance, or in the worst case, it may fall off from the industrial magazine rack. This requires the operator to carry the industrial magazine rack carefully, resulting in reduction in the work efficiency. In addition, the board-shaped member may project or fall off not only in conveyance by the operator, but also due to the acceleration or deceleration during conveyance by an automatic conveyance machine. Increasing the conveyance speed of the automatic conveyance machine to improve the productivity may increase in the risk of projection or falling off of the board-shaped member. A housed board-shaped member having fallen off from the industrial magazine rack would be a defective product, which thus decreases the yield of a non-defective product.

In order to prevent the occurrence of such inconvenience, in conventional various industrial magazine racks, a stopper mechanism has been provided in an opening portion (for example, see Patent Literature 1). The stopper mechanism according to Patent Literature 1 includes a stopper member pivotable to a closing position for closing the front end of a slit provided in a side plate and an open position for opening the front end of the slit, and a coil spring for biasing the stopper member toward the closing position or the opening position.

CITATION LIST

Patent Literature

Patent Literature 1: CN-U-209536116

SUMMARY OF INVENTION

Technical Problem

However, in Patent Literature 1, one end of the coil spring is placed on the inside of the side plate while the other end is placed on the outside of the side plate. In this structure, there is a problem that, when a board-shaped member housed in the slit or a component (for example, resistor, capacitor, transistor, etc.) mounted on the board-shaped member comes into contact with the coil spring, it becomes a defective product, which thus decreases the yield. Hereinafter, board-shaped members and components mounted on the board-shaped members are collectively referred to simply as "board-shaped members".

The present invention has been made in order to solve the problems described above in the prior art, and an object of the present invention is to provide an industrial magazine rack in which a biasing mechanism for biasing a stopper member to a closed position or an open position is prevented from coming into contact with a board-shaped member housed in a rack main body.

Solution to Problem

In order to solve the technical problems described above, the present invention provides an industrial magazine rack comprising: a rack main body that includes a pair of side plates placed to face each other in a left and right direction, a top plate for supporting upper ends of the pair of side plates, and a bottom plate for supporting lower ends of the pair of side plates, the rack main body being provided with, on an inner surface of each of the pair of side plates, a plurality of slits formed to receive end portions of a board-shaped member housed inside of the rack main body; a stopper member that is pivotable between a closed position for closing front ends of the slits and an open position for opening the front ends of the slits; and a biasing mechanism for biasing the stopper member toward the closed position or the open position, the biasing mechanism being mounted to each of the top plate and the bottom plate, wherein the biasing mechanism includes: a base fixed to a lower surface of the top plate or an upper surface of the bottom plate; a pivot bracket for supporting the stopper member, the pivot bracket being supported by the base so as to be pivotable on a pivot axis extending in a vertical direction on an outside of one of the side plates; and a torsion coil spring having a first end portion mounted to the base on an outside of a pivot center of the pivot bracket in the left and right direction and a second end portion mounted to the pivot bracket between the pivot center of the pivot bracket and the first end portion in the left and right direction, and as viewed from above in the vertical direction, the torsion coil spring is formed to: when the second end portion is on one side of an imaginary line connecting the pivot center of the pivot bracket and the first end portion, bias the stopper member toward the closed position; and when the second end portion is on another side of the imaginary line, bias the stopper member toward the open position.

Advantageous Effects of Invention

According to the present invention, it is possible to obtain an industrial magazine rack in which a biasing mechanism for biasing a stopper member to a closed position or an open position is prevented from coming into contact with a board-shaped member housed in a rack main body.

BRIEF DESCRIPTION OF DRAWINGS

FIG. 2A is an enlarged view of the periphery of a biasing mechanism which has biased a stopper member to a closed position.

DESCRIPTION OF EMBODIMENTS

Hereinafter, an embodiment of an industrial magazine rack 1 according to the present invention will be described with reference to the drawings. It should be noted that the embodiment described below is merely an example for embodying the present invention, and does not limit the scope of the present invention to the scope described therein. Therefore, various modifications can be made to the embodiment in the implementation of the present invention.

Figure 1:
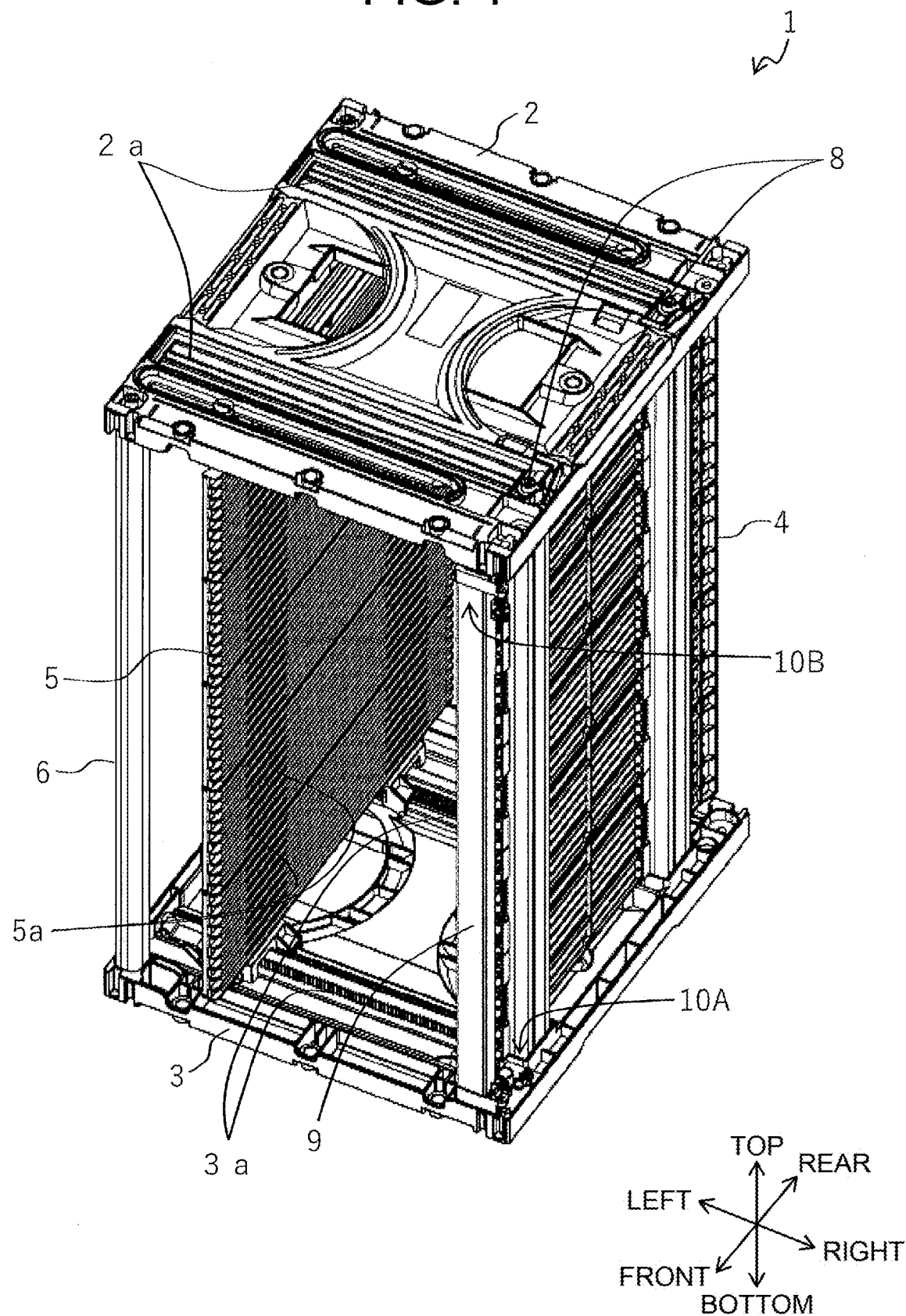
FIG. 1 is a perspective view of the appearance of an industrial magazine rack.

FIG. 1 is a perspective view of the appearance of the industrial magazine rack 1. The industrial magazine rack 1 has a rectangular parallelepiped shape with its front and rear surfaces being open. The industrial magazine rack 1 is shaped into a box whose internal space houses a plurality of board-shaped members (for example, printed wiring boards, liquid crystal substrates, disk substrates, semiconductor wafers) with predetermined spaces being interposed therebetween in the vertical direction.

Among the two open surfaces of the industrial magazine rack 1, the surface on the side through which the board-shaped member is inserted and removed is defined as a "front surface", and the direction toward which the board-shaped member is inserted is defined as the "rear" while the direction from which the board-shaped member is removed is defined as the "front". The left and right of the industrial magazine rack 1 is defined as the direction when it is viewed from the front side.

As illustrated in FIG. 1, the industrial magazine rack 1 includes a box-shaped rack main body provided with a top plate 2, a bottom plate 3, a pair of side plates 4, 5, and supports 6, 7 (support 7 is not illustrated). The top plate 2, the bottom plate 3, and the side plates 4, 5 are formed of, for example, resin materials such as polystyrene resin, ABS resin, or polyamide resin. On the other hand, the supports 6, 7 are formed of metal materials such as aluminum alloy. However, the materials for the components of the industrial magazine rack 1 are not limited to the examples described above.

The top plate 2 defines the upper surface of the rack main body, the bottom plate 3 defines the lower surface of the rack main body, the side plate 4 defines the right surface of the rack main body, and the side plate 5 defines the left surface of the rack main body. The top plate 2 and the bottom plate 3 are placed to face each other in the vertical direction. The pair of side plates 4, 5 are placed to face each other in the left and right direction. In other words, the pair of side plates 4, 5 is placed between the top plate 2 and the bottom plate 3, with a predetermined space in the left and right direction being interposed therebetween, and each of the side plates 4, 5 stands in the vertical direction. A board-shaped member is to be housed in the internal space enclosed by the top plate 2, the bottom plate 3, and the pair of side plates 4, 5.

The upper end of the side plate 4 is detachably fastened to the right end side of the lower surface of the top plate 2 via bolts 8. The lower end of the side plate 4 is detachably fastened to the right end side of the upper surface of the bottom plate 3 via bolts (not illustrated). That is, the side plate 4 (side plate on one side) is fixed to the right end side of the top plate 2 and that of the bottom plate 3. However, the right end of the top plate 2 and that of the bottom plate 3 protrude in the right direction from the side plate 4. On the other hand, the side plate 5 (side plate on the other side) is supported by the top plate 2 and the bottom plate 3 so as to be slidable in the direction in which it comes close to or away from the side plate 4 (in other words, in the left and right direction) along guides 2a, 3a provided on the lower surface of the top plate 2 and the upper surface of the bottom plate 3, respectively.

The upper end of the support 6 is coupled to the left front corner of the lower surface of the top plate 2, and the lower end thereof is coupled to the left front corner of the upper surface of the bottom plate 3. Furthermore, although not illustrated, the upper end of the support 7 is coupled to the left rear corner of the lower surface of the top plate 2, and the lower end thereof is coupled to the left rear corner of the upper surface of the bottom plate 3. That is, the top plate 2 is supported by the side plate 4 and the supports 6, 7.

On the inner surfaces of the side plates 4, 5 (surfaces facing each other), a plurality of slits 4a, 5a (for the slits 4a, see FIG. 2A and FIG. 2B) is formed. Each of the slits 4a is formed such that it is spaced apart from the adjacent slits 4 in the vertical direction with a predetermined distance therebetween. Furthermore, each of the plurality of slits 4a extends in the front and rear direction. Each of the plurality of slits 4a is formed, for example, between a plurality of ridges which protrude toward the side plate 5 from positions spaced apart from each other in the vertical direction on the inner surface of the side plate 4 and extend in the front and rear direction. The same applies to the slits 5a formed on the inner surface of the side plate 5.

The slits 4a, 5a receive the end portions in the left and right direction of the board-shaped member housed inside the industrial magazine rack 1. More specifically, the front ends of the slits 4a, 5a are open, and the board-shaped member is inserted through the front ends of these open slits 4a, 5a toward the rear side thereof. Thus, the end portions of the board-shaped member are supported by the ridges defining the lower side of the slits 4a, 5a. The board-shaped member is removed toward the front direction through the front end of the open slits 4a, 5a. On the other hand, the rear end of the slits 4a, 5a may be open or closed. If the slits 4a, 5a have the open rear end, preferably, a stopper member 9 and a pair of biasing mechanisms 10A, 10B are further provided to open and close the rear end of the slit 4a, which, however, will not be described in the present embodiment.

The industrial magazine rack 1 further includes the stopper member 9 and the pair of biasing mechanisms 10A, 10B. The stopper member 9 and the biasing mechanisms 10A, 10B are mounted, among the pair of side plates 4, 5, on the side of the side plate 4 fixed to the top plate 2 and the bottom plate 3. Furthermore, the stopper member 9 and the biasing mechanisms 10A, 10B are detachably mounted to the industrial magazine rack 1 (more specifically, mounted to the top plate 2 and the bottom plate 3).

Figure 2B:
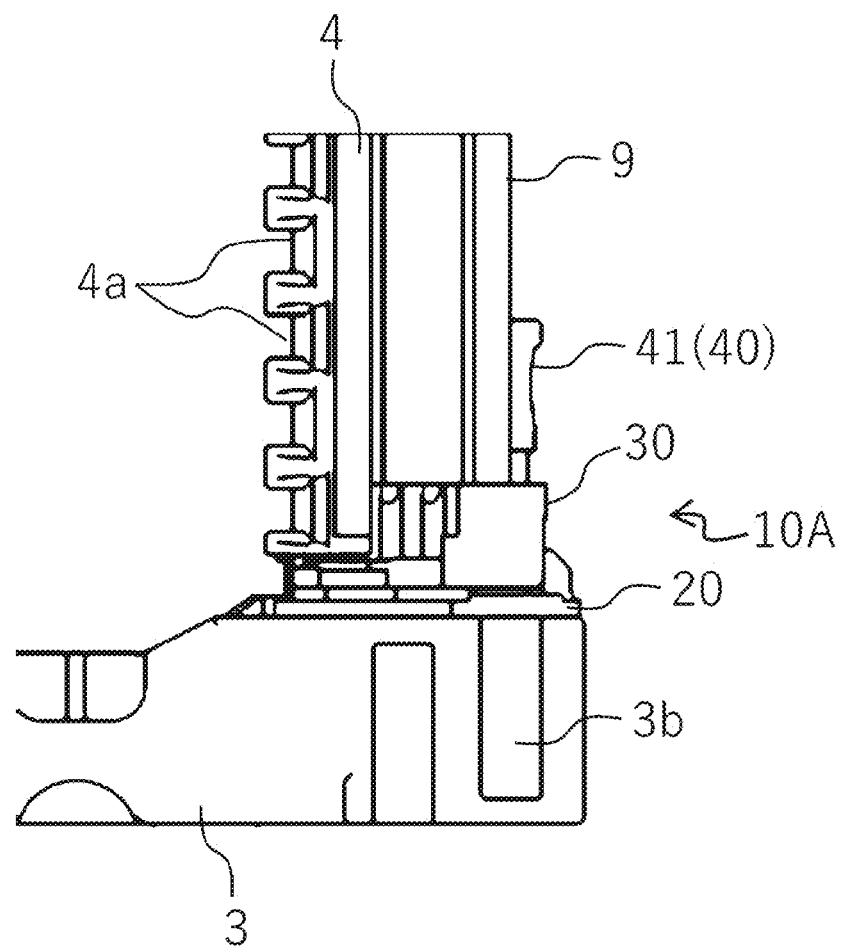
FIG. 2B is an enlarged view of the periphery of a biasing mechanism which has biased a stopper member to an open position.
Figure 2B:
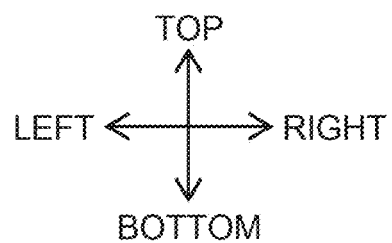
Figure 3:
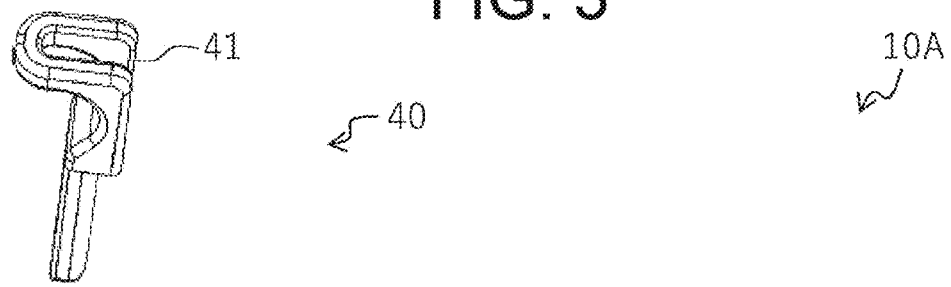
FIG. 3 is an exploded perspective view of a biasing mechanism.
Figure 3:
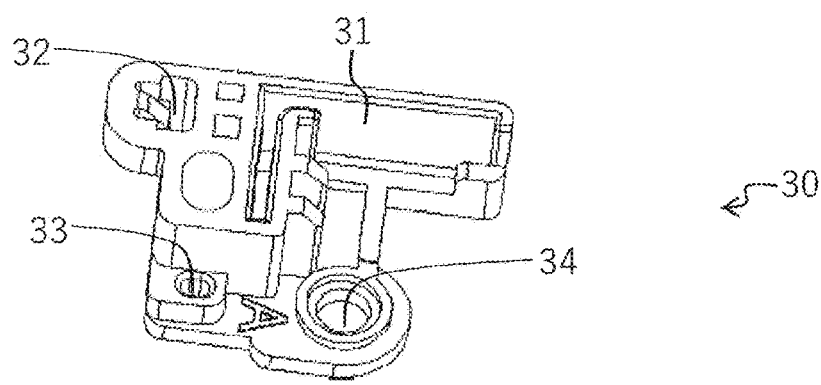
Figure 3:
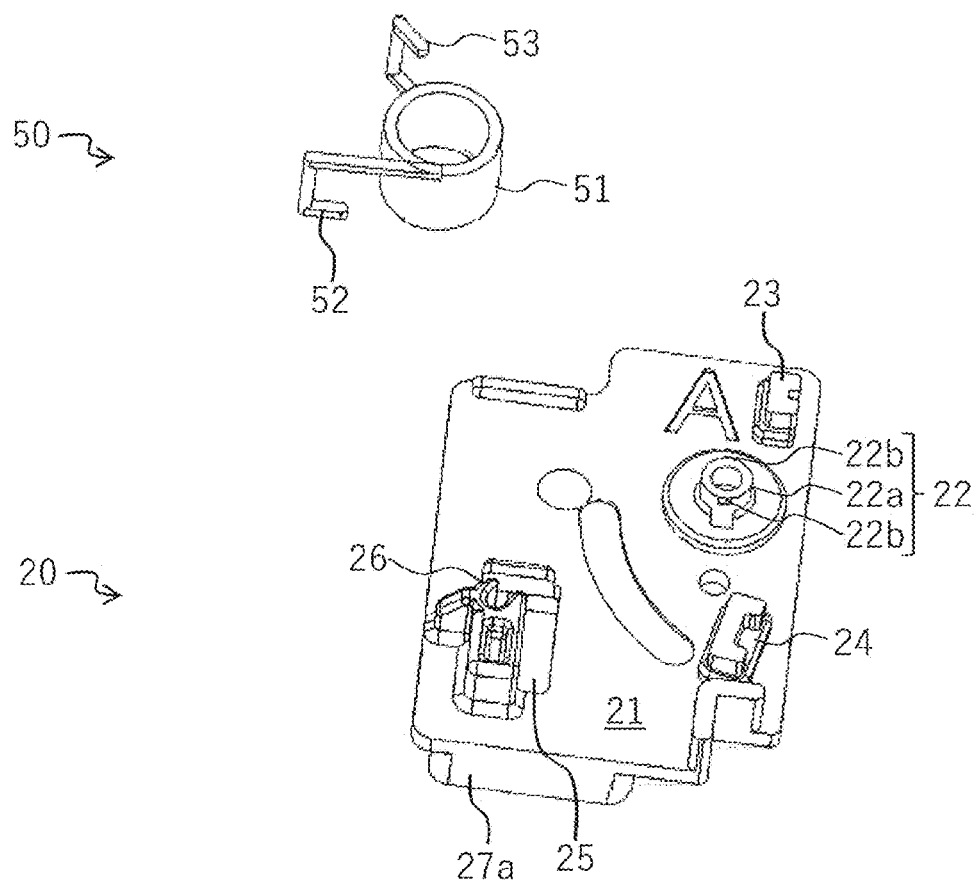
Figure 4:
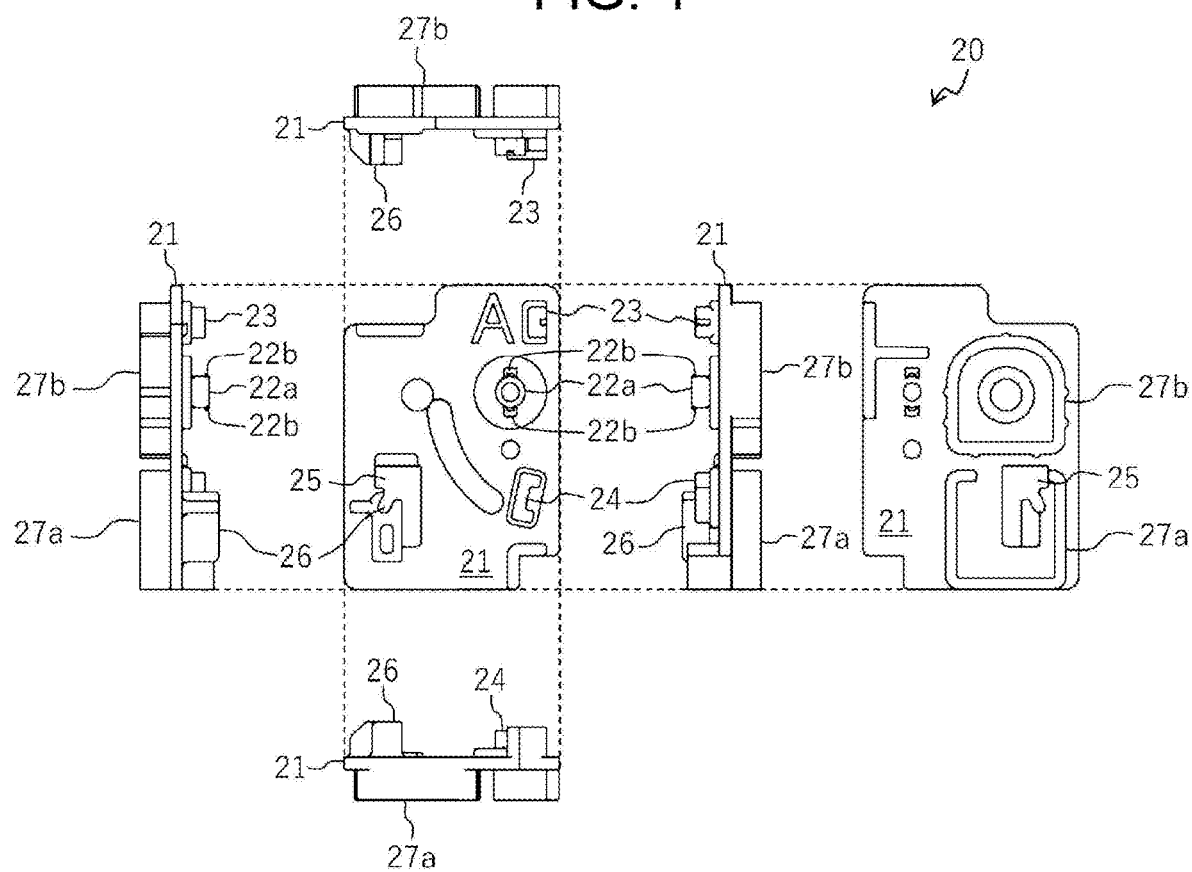
FIG. 4 illustrates the six surfaces of a base.
Figure 5:
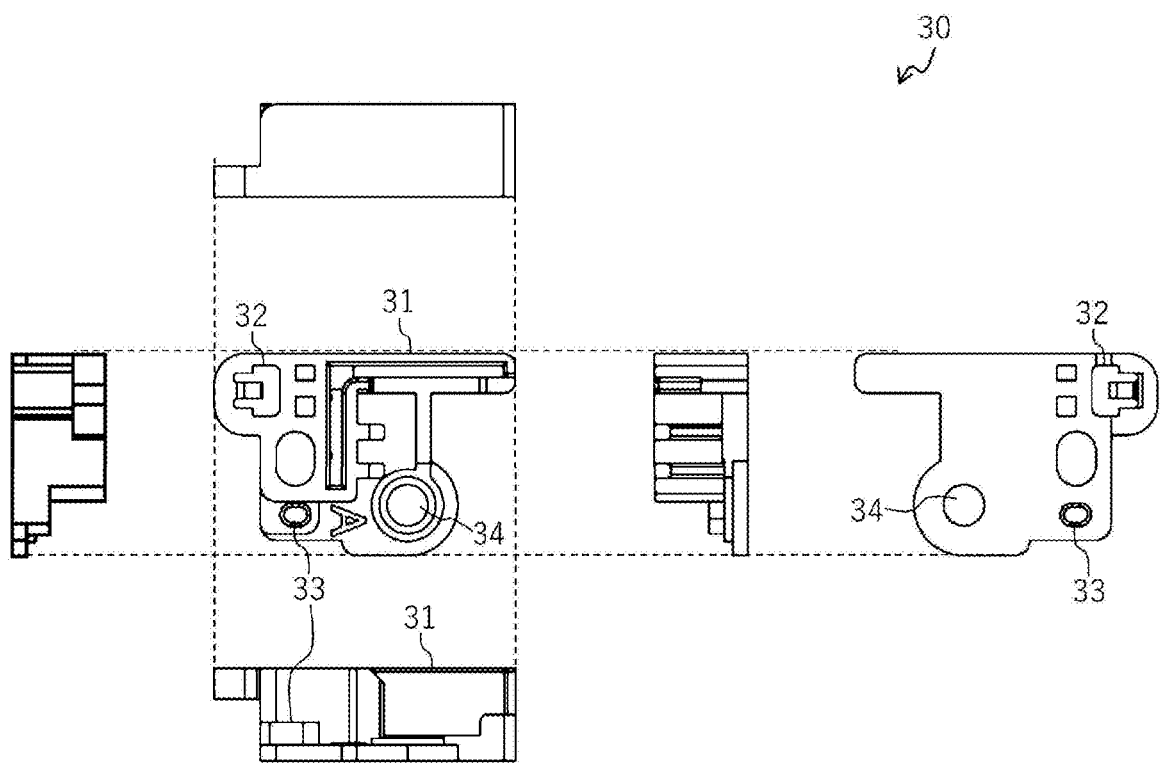
FIG. 5 illustrates the six surfaces of a pivot bracket.
Figure 6A:
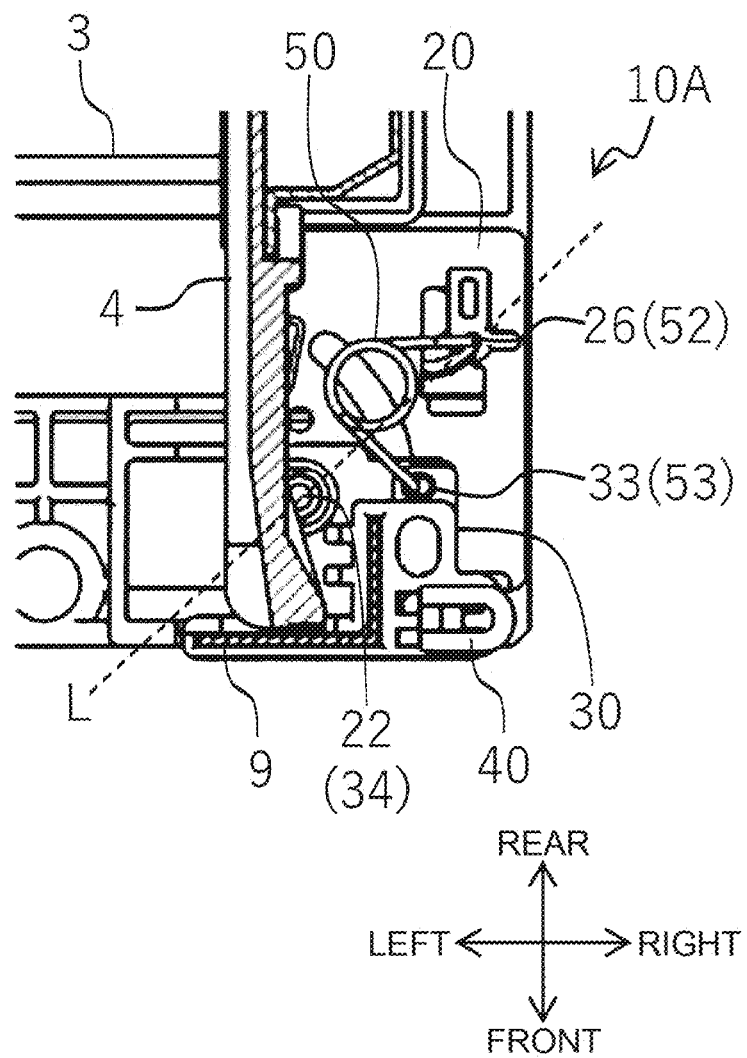
FIG. 6A is a plan view of the periphery of a biasing mechanism of which a second end portion is placed on one side of an imaginary line.
Figure 6B:
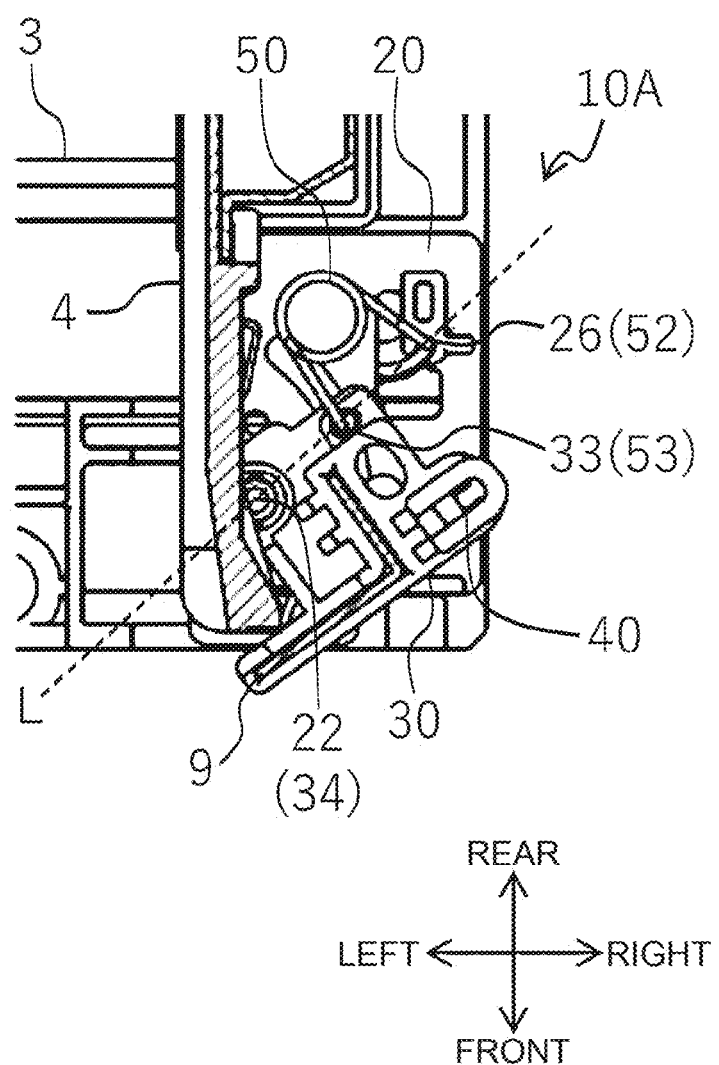
FIG. 6B is a plan view of the periphery of a biasing mechanism of which a second end portion is placed on an imaginary line.
Figure 6C:
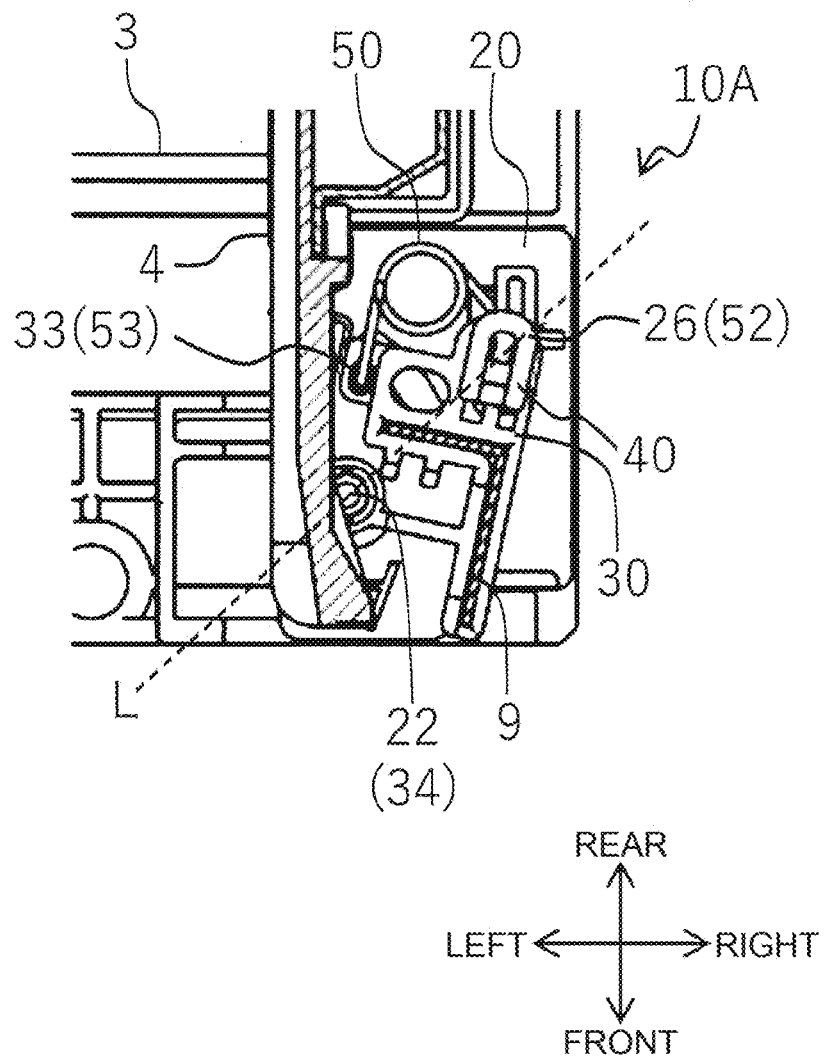
FIG. 6C is a plan view of the periphery of a biasing mechanism of which a second end portion is placed on the other side of an imaginary line.

FIG. 2A is an enlarged view of the periphery of the biasing mechanism 10A which has biased the stopper member 9 to a closed position. FIG. 2B is an enlarged view of the periphery of the biasing mechanism 10A which has biased the stopper member 9 to an open position. FIG. 3 is an exploded perspective view of the biasing mechanism 10A. FIG. 4 illustrates the six surfaces of a base 20. FIG. 5 illustrates the six surfaces of a pivot bracket 30. FIG. 6A is a plan view of the periphery of the biasing mechanism 10A of which a second end portion 53 is placed on one side of an imaginary line L. FIG. 6B is a plan view of the periphery of the biasing mechanism 10A of which the second end portion 53 is placed on the imaginary line L. FIG. 6C is a plan view of the periphery of the biasing mechanism 10A of which the second end portion 53 is placed on the other side of the imaginary line L.

The stopper member 9 is an L-shaped angle having an L-shaped cross section (cross section orthogonal to the longitudinal direction). The stopper member 9 may be formed, for example, with a flat plate made of metal such as aluminum alloy being bent, or may be formed with a metal material such as aluminum alloy being extruded. The dimension in the longitudinal direction of the stopper member 9 generally corresponds to the height of the side plate 4. The stopper member 9 is supported by the top plate 2 and the bottom plate 3 through the biasing mechanisms 10A, 10B such that it can pivot. More specifically, the stopper member 9 pivots on a pivot axis extending in the vertical direction between a closed position illustrated in FIG. 2A and an open position illustrated in FIG. 2B.

As illustrated in FIG. 2A, the closed position is a position for closing the front end of the slit 4a. That is, placing the stopper member 9 in the closed position does not allow the board-shaped member to be inserted into the rack main body through the front end of the slits 4a, 5a, nor to be removed from the rack main body therethrough. On the other hand, as illustrated in FIG. 2B, the open position is a position for opening the front end of the slit 4a. That is, placing the stopper member 9 in the open position allows the board-shaped member to be inserted or removed from the rack main body through the front end of the slits 4a, 5a.

The pair of biasing mechanisms 10A, 10B biases the stopper member 9 toward the closed position or the open position. More specifically, the pair of biasing mechanisms 10A, 10B biases the stopper member 9 toward the closed position when the stopper member 9 is closer to the closed position than an intermediate position between the closed position and the open position, and biases the stopper member 9 toward the open position when the stopper member 9 is closer to the open position than the intermediate position. The biasing mechanism 10A is mounted to the upper surface of the bottom plate 3, and the biasing mechanism 10B is mounted to the lower surface of the top plate 2.

The biasing mechanism 10B fundamentally has the same structure as that of the biasing mechanism 10A although being inverted left to right therefrom, and accordingly, hereinafter, the structure of the biasing mechanism 10A will be described. Replacing the "bottom plate 3" with the "top plate 2" and reversing the upper and lower sides enables the explanation for the biasing mechanism 10A to be applied to the structure and arrangement of the biasing mechanism 10B.

As illustrated in FIG. 3, the biasing mechanism 10A mainly includes the base 20, the pivot bracket 30, a lock pin 40 (lock member), and a torsion coil spring 50. The base 20, the pivot bracket 30, and the lock pin 40 are formed of, for example, resin materials. The torsion coil spring 50 is formed of, for example, a metal material. However, the materials for the components of the biasing mechanism 10A are not limited to the examples described above.

The base 20 is fixed to the upper surface of the bottom plate 3. The base 20 supports the pivot bracket 30 and the torsion coil spring 50 on its top surface side (top surface side when the biasing mechanism 10A is mounted to the bottom plate 3). As illustrated in FIG. 3 and FIG. 4, the base 20 mainly includes a main plate 21, a bracket support portion 22, contact portions 23, 24, an engagement hole 25, a spring holding portion 26, and a press-fitted portions 27a, 27b.

The main plate 21 is a flat board-shaped portion. On the top surface (the surface for supporting the pivot bracket 30 and the torsion coil spring 50) of the main plate 21, the bracket support portion 22, the contact portions 23, 24, and the spring holding portion 26 are formed. On the back surface (the opposite surface of the top surface) of the main plate 21, the press-fitted portions 27a, 27b are formed. The engagement hole 25 passes through the main plate 21 in the thickness direction.

The bracket support portion 22 supports the pivot bracket 30 so as to allow the pivot bracket 30 to pivot on a pivot axis extending in the vertical direction. Furthermore, the bracket support portion 22 couples the pivot bracket 30 with the base 20. The bracket support portion 22 includes, for example, a projection 22a protruding from the top surface of the main plate 21 and one or more engagement claws 22b provided at the distal end of the projection 22a.

The projection 22a is formed to have a circular cross section (in the present embodiment, cylindrical shape). The engagement claw 22b protrudes outward in the radial direction from the outer circumference surface of the projection 22a at the distal end of the projection 22a. In the present embodiment, the engagement claws 22b are provided at two positions spaced apart from each other with a predetermined distance (in the present embodiment, at the interval of 180°) in the circumferential direction of the projection 22a, respectively. The projection 22a enters a through hole 34 of the pivot bracket 30, which will be described later. The engagement claw 22b passes through the through hole 34 and engages with a wall surface defining the through hole 34. However, the number of the engagement claws 22b is not limited to two, and may be one or three or more.

The contact portions 23, 24 limit the pivot range of the pivot bracket 30. The contact portions 23, 24 come into contact with the pivot bracket 30 when the stopper member 9 is in the closed or open position to prevent the pivot bracket 30 (in other words, stopper member 9) from further pivoting. More specifically, the contact portion 23 (first contact portion) comes into contact with the pivot bracket 30 when the stopper member 9 is in the closed position, and limits the stopper member 9 to prevent it from pivoting further in the direction from the open position toward the closed position (that is, in the clockwise direction illustrated in FIG. 6A). The contact portion 24 (second contact portion) comes into contact with the pivot bracket 30 when the stopper member 9 is in the open position, and limits the stopper member 9 to prevent it from pivoting further in the direction from the closed position toward the open position (that is, in the counterclockwise direction illustrated in FIG. 6C).

The engagement hole 25 is formed at a position that can receive the lock pin 40 supported by the pivot bracket 30 and entering the engagement hole 25 when the stopper member 9 is in the open position. The spring holding portion 26 supports the first end portion 52 of the torsion coil spring 50, which will be described later, so as to allow it to pivot. The press-fitted portions 27a, 27b are portions that are press-fitted between reinforcing ribs provided on the upper surface of the bottom plate 3, thereby fixing the base 20 to the bottom plate 3.

The bolts for fastening the bottom plate 3 and the side plate 4 are loosened (removed) so that the base 20 of the biasing mechanisms 10A can be mounted to the upper surface of the bottom plate 3. As illustrated in FIG. 2A and FIG. 2B, the bottom plate 3 and the side plate 4 are fastened again with the bolts so that the base 20 of the biasing mechanism 10A can be sandwiched between the bottom plate 3 and the side plate 4. At this time, as illustrated in FIG. 6A to FIG. 6C, the bracket supporting portion 22 is located on the outside of the side plate 4 (the opposite side of the internal space of the industrial magazine rack 1). The spring holding portion 26 is located on the outside of the bracket supporting portion 22 in the left and right direction and more rearward than the bracket supporting portion 22 in the front and rear direction.

The pivot bracket 30 is supported by the bracket support portion 22 of the base 20 such that it can pivot on a pivot axis extending in the vertical direction. That is, the center of pivot of the pivot bracket 30 (=the projection 22a of the bracket support portion 22) is located on the outside of the side plate 4 in the left and right direction. Furthermore, the pivot bracket 30 of the biasing mechanism 10A supports the lower end of the stopper member 9, and the pivot bracket 30 of the biasing mechanism 10B supports the upper end of the stopper member 9. As illustrated in FIG. 3 and FIG. 5, the pivot bracket 30 mainly includes a stopper holding portion 31, a pin holding portion 32, a spring holding portion 33, and a through hole 34.

The stopper holding portion 31 holds the end portion in the longitudinal direction of the stopper member 9. The stopper holding portion 31 includes a slit having the shape corresponding to the shape (L-shape) of the end portion in the longitudinal direction of the stopper member 9. That is, the lower end of the stopper member 9 is inserted into or removed from the stopper holding portion 31 in the vertical direction, thereby being attached to or detached from the pivot bracket 30. The pin holding portion 32 holds the lock pin 40. The pin holding portion 32 is provided with a through hole for allowing the distal end of the lock pin 40 to protrude toward the back surface side (toward the side of the bottom plate 3 and the side of the base 20) or retract therefrom. The spring holding portion 33 supports the second end portion 53 of the torsion coil spring 50, which will be described later, so as to allow it to pivot.

The through hole 34 passes through the pivot bracket 30 in the thickness direction at the center of pivot of the stopper holding portion 31. The diameter of the through hole 34 is set to be more than the outer dimension of the projection 22a and less than the diameter of an imaginary circle connecting the distal ends of the plurality of engagement claws 22b. That is, when the projection 22a is press-fitted into the through hole 34 such that the engagement claws 22b pass therethrough, the engagement claws 22b engage with the wall surface defining the through hole 34 (that is, the upper surface of the pivot bracket 30). This causes the base 20 and the pivot bracket 30 to be one unit. Furthermore, this allows the pivot bracket 30 to pivot on the projection 22a with respect to the base 20.

Then, as illustrated in FIG. 6A to FIG. 6C, in the biasing mechanism 10A mounted to the bottom plate 3, as viewed from above, both in the front and rear direction and the left and right direction, the spring holding portion 33 (that is, the second end portion 53 of the torsion coil spring 50) is located between the bracket support portion 22 (that is, the center of pivot of the pivot bracket 30) and the spring holding portion 26 (that is, the first end portion 52 of the torsion coil spring 50). This positional relationship is kept over the entire pivot range of the pivot bracket 30.

The lock pin 40 switches whether to lock or allow the pivot of the pivot bracket 30 when the stopper member 9 is in the closed position or the open position. The lock pin 40 is a long and rod-shaped member. The lock pin 40 is held by the pin holding portion 32 with the longitudinal direction thereof being directed in the vertical direction. Furthermore, the lock pin 40 is held by the pin holding portion 32 so that it can move in the longitudinal direction (that is, in the vertical direction direction).

The distal end (lower end) of the lock pin 40 is inserted into the pin holding portion 32 from the top surface side (the opposite side of the base 20) of the pivot bracket 30, and protrudes from the back surface side (the side facing the base 20) of the pivot bracket 30. On the other hand, at the proximal end (upper end) of the lock pin 40, a grip portion 41 that is gripped by an operator when he or she makes the lock pin 40 move in the vertical direction is provided.

As illustrated in FIG. 2A, when the stopper member 9 is in the closed position, the pin holding portion 32 is placed at a position allowing it to enter an engagement groove 3b, which is provided on the front surface of the bottom plate 3, in the vertical direction. In this state, when the lock pin 40 is pushed down to cause the distal end thereof to protrude from the back surface of the pivot bracket 30, the lock pin 40 engages with (enters) the engagement groove 3b. Thus, the lock pin 40 engages with the bottom plate 3 so that the stopper member 9 can be locked in the closed position (in other words, the stopper member 9 is prevented from pivoting toward the open position). This position of the lock pin 40 is an example of a first locking position.

On the other hand, in the position illustrated in FIG. 2A, when the lock pin 40 is pushed up to cause the distal end thereof to be pulled toward the back surface of the pivot bracket 30, the engagement between the distal end of the lock pin 40 and the engagement groove 3b is released (that is, the lock pin 40 is pulled out from the engagement groove 3b). Thus, the stopper member 9 is allowed to pivot toward the open position. This position of the lock pin 40 is an example of a first release position.

As illustrated in FIG. 6C, when the stopper member 9 is in the open position, the pin holding portion 32 is placed at a position facing the engagement hole 25 of the base 20 in the vertical direction. In this state, when the lock pin 40 is pushed down to cause the distal end thereof to protrude from the back surface of the pivot bracket 30, the lock pin 40 enters the engagement hole 25. Thus, the lock pin 40 engages with the base 20 so that the stopper member 9 can be locked in the open position (in other words, the stopper member 9 is prevented from pivoting toward the closed position). This position of the lock pin 40 is an example of a second locking position.

On the other hand, in the state illustrated in FIG. 6C, when the lock pin 40 is pushed up to cause the distal end to be pulled toward the back surface of the pivot bracket 30, the distal end of the lock pin 40 withdraws from the engagement hole 25 and thus the engagement with the base 20 is released. This allows the stopper member 9 to pivot toward the closed position. This position of the lock pin 40 is an example of a second release position.

In the first lock position and the second lock position, although the position of the stopper member 9 (pivot bracket 30), which serves as the precondition of the lock positions, differs from each other, the position of the lock pin 40 in the vertical direction within the pivot bracket 30 is the same therebetween. Similarly, in the first release position and the second release position, although the position of the stopper member 9 (pivot bracket 30), which serves as the precondition of the release positions, differs from each other, the position of the lock pin 40 in the vertical direction within the pivot bracket 30 is the same therebetween.

The torsion coil spring 50 is formed with a bended metal wire to be one unit. The torsion coil spring 50 biases the pivot bracket 30 to the base 20, thereby indirectly biasing the stopper member 9 supported by the pivot bracket 30. The torsion coil spring 50 mainly includes a coil portion 51, the first end portion 52, and the second end portion 53.

The coil portion 51 is a portion around which a metal wire is wound to have a coil shape, of which the outer shape is cylindrical. The first end portion 52 is a portion protruding outward in the radial direction from one end in the axial direction of the cylindrical coil portion 51. The second end portion 53 is a portion protruding outward in the radial direction from the other end in the axial direction of the cylindrical coil portion 51. The first end portion 52 and the second end portion 53 are arranged at positions different from each other in the circumferential direction of the cylindrical coil portion 51, and protrude toward positions different from each other. That is, when the torsion coil spring 50 is viewed in the axial direction, the first end portion 52 and the second end portion 53 are arranged to form a predetermined angle.

Each of the first end portion 52 and the second end portion 53 protrudes outward in the radial direction from the coil portion 51, then is bent in the axial direction of the coil portion 51, and further bent toward the coil portion 51. The bent portion of the first end portion 52 is mounted to the spring holding portion 26 of the base 20, and the bent portion of the second end portion 53 is mounted to the spring holding portion 33 of the pivot bracket 30. That is, the first end portion 52 serves as a fixed end, and the second end portion 53 serves as a pivot end.

The torsion coil spring 50 is mounted to the base 20 and the pivot bracket 30 with the first end 52 and the second end 53 being compressed in the direction of bringing them close to each other (in other words, the direction of reducing the angle formed between the first end 52 and the second end 53). Thus, the torsion coil spring 50 generates a biasing force in the direction of separating the first end portion 52 and the second end portion 53 from each other (in other words, the direction of increasing the angle formed between the first end portion 52 and the second end portion 53).

As illustrated in FIG. 6A, when the stopper member 9 is in the closed position, the second end portion 53 is on one side of the imaginary line L connecting the center of pivot of the pivot bracket 30 and the first end portion 52. The one side of the imaginary line L illustrated in FIG. 6A to FIG. 6C corresponds to the right front side of the imaginary line L (the side which is forward of the imaginary line L and also away from the side plate 4). Thus, the torsion coil spring 50 biases the pivot bracket 30 in a first direction (in the clockwise direction in the example of FIG. 6A to FIG. 6C) with respect to the base 20 so that the stopper member 9 is directed toward the closed position. At this time, the pivot bracket 30 comes into contact with the contact portion 23, whereby the pivot bracket 30 is prevented from excessively pivoting in the first direction.

Next, as illustrated in FIG. 6B, when an operator makes the pivot bracket 30 pivot in a second direction (in the counterclockwise direction in the example of FIG. 6A to FIG. 6C) against the biasing force of the torsion coil spring 50, the stopper member 9 supported by the pivot bracket 30 pivots toward the open position, and the second end portion 53 approaches the imaginary line L. The more the second end portion 53 approaches the imaginary line L, the more the first end portion 52 and the second end portion 53 approach with each other (that is, the biasing force of the torsion coil spring 50 increases).

When the second end portion 53 moves beyond the imaginary line L from one side thereof to the other side, the biasing direction of the pivot bracket 30 (that is, the stopper member 9) by the torsion coil spring 50 is reversed. The other side of the imaginary line L in FIG. 6A to FIG. 6C corresponds to the left rear side of the imaginary line L (the side which is rearward of the imaginary line L and closer to the side plate 4). Thus, the torsion coil spring 50 biases the pivot bracket 30 in the second direction with respect to the base 20 so that the stopper member 9 is directed toward the open position. Then, as illustrated in FIG. 6C, when the stopper member 9 reaches the open position, the pivot bracket 30 comes into contact with the contact portion 24, whereby the pivot bracket 30 is prevented from excessively pivoting in the second direction.

That is, when the operator makes the pivot bracket 30 in the second direction until the second end portion 53 moves beyond the imaginary line L from one side to the other side, thereafter, the stopper member 9 automatically moves to the open position due to the biasing force of the torsion coil spring 50. On the other hand, for making the stopper member 9 pivot from the open position to the closed position, the operator merely performs the operation described above in the reverse direction.

According to the embodiment described above, for example, the following advantageous effects can be obtained.

According to the embodiment described above, biasing the stopper member 9 toward the closed position by means of the biasing mechanisms 10A, 10B enables the stopper member 9 to be prevented from being unintentionally opened even if the industrial magazine rack 1 is tilted or collides with something. This makes it possible to prevent the board-shaped member from protruding from the industrial magazine rack 1 and thus being damaged during transportation of the industrial magazine rack 1 by an operator or conveyance thereof by an automatic transport machine. As a result, suppression of decrease in the yield as well as improvement in the productivity can be achieved.

Furthermore, the arrangement in which the projection 22a (the center of pivot of the pivot bracket 30), the spring holding portion 26 (the first end portion 52), and the spring holding portion 33 (the second end portion 53) of the biasing mechanisms 10A, 10B according to the present embodiment are placed on the upper surface of the base 20 and on the outside of the side plate 4 makes it possible to prevent the components of the biasing mechanisms 10A, 10B from coming into contact with the board-shaped member housed in the internal space of the industrial magazine rack 1.

Still further, according to the embodiment described above, the second end portion 53 moves across the imaginary line L, whereby the biasing direction by the torsion coil spring 50 is switched. This makes it possible to bias the stopper member 9 so as to keep it in the closed position when being in the closed position while biasing the stopper member 9 so as to keep it in the open position when being in the open position by means of one torsion coil spring 50. As a result, reduction in the number of components of the biasing mechanisms 10A, 10B and thus simplification of the structure can be achieved.

Still further, according to the embodiment described above, the arrangement in which the more the second end portion 53 approaches the imaginary line L, the more the biasing force of the torsion coil spring 50 increases makes it possible to prevent the stopper member 9 from unintentionally pivoting even if a small force is applied to the stopper member 9 or the pivot bracket 30.

Still further, according to the embodiment described above, placing the lock pin 40 in the first lock position or the second lock position enables the stopper member 9 to be prevented from pivoting. This makes it possible to prevent the stopper member 9 from unintentionally pivoting even when a large force is applied to the stopper member 9 or the pivot bracket 30. In addition, due to the arrangement in which the stopper member 9 can be locked in both the closed position and the open position by means of one lock pin 40, reduction in the number of components of the biasing mechanisms 10A, 10B and simplification of the structure can be achieved.

Still further, according to the embodiment described above, the arrangement in which the pivot range of the pivot bracket 30 can be limited by the contact portions 23, 24 makes it possible to prevent the stopper member 9 from excessively pivoting. In particular, the stopper member 9 can be prevented from pivoting beyond the closed position, which can prevent the stopper member 9 from coming into contact with the side plate 4.

Still further, according to the embodiment described above, among the pair of side plates 4, 5, the stopper member 9 and the biasing mechanisms 10A, 10B are mounted to the side plate 4 which is formed to be fixed. This can simplify the mounting structure as compared with the case where the stopper member 9 and the biasing mechanisms 10A, 10B are mounted on the side plate 5 which is formed to be movable.

Still further, according to the embodiment described above, inserting the projection 22a provided with the engagement claws 22b into the through hole 34 causes the base 20 and the pivot bracket 30 to be one unit. This makes it easier to attach the biasing mechanisms 10A, 10B as compared with the case where the base 20 and the pivot bracket 30 are separately mounted to the top plate 2 and the bottom plate 3.

In the embodiment described above, the example in which the projection 22a and the engagement claws 22b are provided on the base 20 while the through hole 34 is formed on the pivot bracket 30 has been described, however, such an arrangement that the projection 22a and the engagement claws 22b are provided on the pivot bracket 30 while the through hole 34 is formed on the base 20 may be employed. That is, the projection 22a and the engagement claws 22b may be provided on one of the base 20 and the pivot bracket 30, and the through hole 34 may be formed on the other one of the base 20 and the pivot bracket 30. Furthermore, an approach for making the base 20 and the pivot bracket 30 in one unit is not limited to the combination of the projection 22a, the engagement claws 22b, and the through hole 34.

Still further, according to the embodiment described above, press-fitting the press-fitted portions 27a, 27b between the reinforcing ribs causes the base 20 to be fixed to the top plate 2 and the bottom plate 3. Still further, the base 20 is sandwiched between the top plate 2 or the bottom plate 3 and the side plate 4, thereby being fixed. Due to the arrangement described above, the biasing mechanisms 10A, 10B can be mounted to the industrial magazine rack 1 without using a special tool.

REFERENCE SIGNS LIST

1 . . . industrial magazine rack, 2 . . . top plate, 2a, 3a . . . guide, 3 . . . bottom plate, 3b . . . engagement groove, 4, 5 . . . side plate, 4a, 5a . . . slit, 6, 7 . . . support, 8 . . . bolt, 9 . . . stopper member, 9a . . . engagement groove, 10A, 10B . . . biasing mechanism, 20 . . . base, 21 . . . main plate, 22 . . . bracket support portion, 22a . . . projection, 22b . . . engagement claw, 23, 24 . . . contact portion, 25 . . . engagement hole, 26, 33 . . . spring holding portion, 27a, 27b . . . press-fitted portion, 30 . . . pivot bracket, 31 . . . stopper holding portion, 32 . . . pin holding portion, 34 . . . through hole, 40 . . . lock pin, 41 . . . grip portion, 50 . . . torsion coil spring, 51 . . . coil portion, 52 . . . first end portion, 53 . . . second end portion

The invention claimed is:
1. An industrial magazine rack comprising:
a rack main body that includes a pair of side plates placed to face each other in a left and right direction, a top plate for supporting upper ends of the pair of side plates, and a bottom plate for supporting lower ends of the pair of side plates, the rack main body being provided with, on an inner surface of each of the pair of side plates, a plurality of slits formed to receive end portions of a board-shaped member housed inside of the rack main body;
a stopper member that is pivotable between a closed position for closing front ends of the slits of one of the side plates and an open position for opening the front ends of the slits of the one of the side plates; and
a biasing mechanism for biasing the stopper member toward the closed position or the open position, the biasing mechanism being mounted to each of the top plate and the bottom plate, wherein
the biasing mechanism includes:
  a base fixed to a lower surface of the top plate or an upper surface of the bottom plate;
  a pivot bracket for supporting the stopper member, the pivot bracket being supported by the base so as to be pivotable on a pivot axis extending in a vertical direction on an outside of one of the side plates; and
  a torsion coil spring having a first end portion mounted to the base on an outside of a pivot center of the pivot bracket in the left and right direction and a second end portion mounted to the pivot bracket between the pivot center of the pivot bracket and the first end portion in the left and right direction, and
  as viewed from above in the vertical direction, the torsion coil spring is formed to:
    when the second end portion is on one side of an imaginary line connecting the pivot center of the pivot bracket and the first end portion, bias the stopper member toward the closed position; and when the second end portion is on another side of the imaginary line, bias the stopper member toward the open position.

2. The industrial magazine rack according to claim 1, wherein the torsion coil spring is mounted to the base and the pivot bracket with the first end portion and the second end portion being compressed in a direction of bringing the first end portion and the second end portion close to each other, and as approaching the imaginary line, the second end portion approaches the first end portion to increase a biasing force.

3. The industrial magazine rack according to claim 1, wherein the biasing mechanism includes a lock member supported by the pivot bracket so as to be movable between a first lock position and a first release position when the stopper member is in the closed position, the first lock position being for making the stopper member engage with the top plate or the bottom plate to be locked in the closed position, and the first release position being for releasing engagement of the stopper member with the top plate or the bottom plate and allowing for pivot of the stopper member toward the open position.

4. The industrial magazine rack according to claim 3, wherein the lock member is movable between a second lock position and a second release position when the stopper member is in the open position, the second lock position being for making the stopper member engage with the base to be locked in the open position, and the second release position being for releasing engagement of the stopper member with the base and allowing for pivot of the stopper member toward the closed position.

5. The industrial magazine rack according to claim 1, wherein the base includes:

a first contact portion that comes into contact with the pivot bracket when the stopper member is in the closed position to limit pivot of the stopper member in a direction from the open position toward the closed position; and a second contact portion that comes into contact with the pivot bracket when the stopper member is in the open position to limit pivot of the stopper member in a direction from the closed position toward the open position.

6. The industrial magazine rack according to claim 1, wherein one of the side plates is fixed to the top plate and the bottom plate, another one of the side plates is formed to be slidable in a direction of moving close to and away from the one of the side plates.

7. The industrial magazine rack according to claim 1, wherein on one of the base or the pivot bracket includes a through hole formed to pass through the pivot center of the pivot bracket in the vertical direction, and another one of the base or the pivot bracket includes:

a projection to be inserted into the through hole; and one or more engagement claws protruding outward in a radial direction from an outer peripheral surface of a distal end of the projection to engage with a wall surface defining the through hole.

8. The industrial magazine rack according to claim 1, wherein the base includes a press-fitted portion provided on an opposite side of a surface for supporting the pivot bracket, the press-fitted portion being formed to be press-fitted between reinforcing ribs provided on the lower surface of the top plate or the upper surface of the bottom plate.

9. The industrial magazine rack according to claim 1, wherein the base is sandwiched between the top plate or the bottom plate and the side plates.

\* \* \* \* \*